United States Patent
Montree et al.

(10) Patent No.: US 7,671,447 B2
(45) Date of Patent: Mar. 2, 2010

(54) BIPOLAR TRANSISTOR AND METHOD OF MANUFACTURING THE SAME

(75) Inventors: Andreas Hubertus Montree, Leuven (BE); Jan Willem Slotboom, Eersel (NL); Prabhat Agarwal, Leuven (BE); Philippe Meunier-Beillard, Leuven (BE)

(73) Assignee: NXP B.V., Eindhoven (NL)

( * ) Notice: Subject to any disclaimer, the term of this patent is extended or adjusted under 35 U.S.C. 154(b) by 327 days.

(21) Appl. No.: 11/632,614

(22) PCT Filed: Jul. 7, 2005

(86) PCT No.: PCT/IB2005/052260

§ 371 (c)(1),
(2), (4) Date: Jan. 16, 2007

(87) PCT Pub. No.: WO2006/008689

PCT Pub. Date: Jan. 26, 2006

(65) Prior Publication Data

US 2008/0083968 A1     Apr. 10, 2008

(30) Foreign Application Priority Data

Jul. 15, 2004     (EP)     ................................ 04103382

(51) Int. Cl.
H01L 23/58     (2006.01)
(52) U.S. Cl. .................. 257/565; 257/591; 257/592; 257/593; 257/E21.35
(58) Field of Classification Search .............. 257/565, 257/591, 592, 593, E21.35, E21.372
See application file for complete search history.

(56) References Cited

U.S. PATENT DOCUMENTS 5,198,692 A * 3/1993 Momose ................. 257/591
5,567,630 A * 10/1996 Matsumoto et al. ......... 438/21
6,384,469 B1 * 5/2002 Chantre .................. 257/565

(Continued)

FOREIGN PATENT DOCUMENTS

JP     06-252158     * 9/1994

OTHER PUBLICATIONS

Kruger D et al: "Ultrashallow Secondary . . ." Journal of Vacuum Science & Tech. B.: Microelectronics Processing and Phenomena, American Vaccum Society New York, US vol. 16 No. 1; Jan. 1998 pp. 292-297.

(Continued)

*Primary Examiner*—Sue Purvis
*Assistant Examiner*—Tan N Tran

(57) ABSTRACT

The invention relates to a semiconductor device (10) with a semiconductor body (12) comprising a bipolar transistor with an emitter region (1), a base region (2) and a collector region (3) of, respectively, a first conductivity type, a second conductivity type, opposite to the first conductivity type, and the first conductivity type, wherein, viewed in projection, the emitter region (1) is positioned above or below the base region (2), and the collector region (3) laterally borders the base region (2). According to the invention, the base region (2) comprises a highly doped subregion (2A) the doping concentration of which has a delta-shaped profile in the thickness direction, and said highly doped sub-region (2A) extends laterally as far as the collector region (3). Such a lateral bipolar transistor has excellent high-frequency properties and a relatively high breakdown voltage between the base and collector regions (2, 3), implying that the device is suitable for high power applications. The doping concentration lies preferably between about $10^{19}$ and about $10^{20}$ at/cm$^3$, and the thickness of the sub-region (2A) lies between 1 and 15 nm and preferably between 1 and 10 nm. The invention also comprises a method of manufacturing such a device (10).

11 Claims, 3 Drawing Sheets

U.S. PATENT DOCUMENTS

Figure 1:
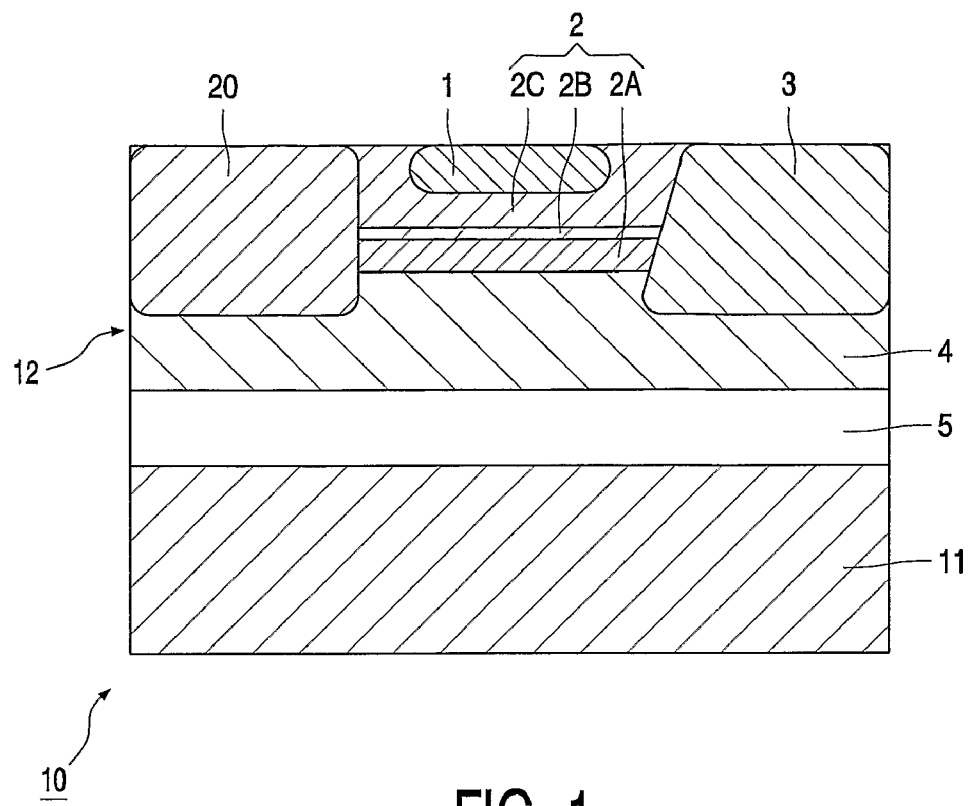

2002/0130409 A1* 9/2002 Oue et al. .................. 257/720
2003/0160266 A1* 8/2003 Yanagisawa ................ 257/197
2005/0023642 A1* 2/2005 Heinemann et al. ......... 257/565

OTHER PUBLICATIONS

Jin Cai et al: "Vertical Sige-Base Bipolar Transistors on CMOS-Compatible SOI Substrate"; Proceedings of the 2003 Bipolar/BiCMOS Circuits and Tech. Meeting Toulouse Francs Sep. 28-30, 2003; IEEE Bipolar/BiCMOS Circuits and Tech. NY; Sep. 28, 2003 pp. 215-218.

Sawano K et al: "Surface Smoothing of SiGe Strain-Relaxed Layers by Chemical Mechanical Polishing" Materials Science and Engineering B, Elsevier Sequoia Lausanne CH vol. 89 No. 1-3, Feb. 14, 2002 pp. 406-409.

* cited by examiner

BIPOLAR TRANSISTOR AND METHOD OF MANUFACTURING THE SAME

The invention relates to a semiconductor device with a semiconductor body comprising a bipolar transistor having an emitter region, a base region and a collector region of, respectively, a first conductivity type, a second conductivity type opposite to the first conductivity type, and the first conductivity type, wherein, viewed in projection, the emitter region is situated above or below the base region, and the collector region laterally borders the base region. Such a device is particularly suitable for high-frequency applications, because the collector-substrate capacitance and the base-collector capacitance are comparatively small. The invention also relates to a method of manufacturing such a device.

Such a device and such a method are known from United States patent specification U.S. Pat. No. 6,384,469, published on 7May 2002. In said document a description is given of a npn-type lateral bipolar transistor. On a side of the base region there is a base connection region, and on an opposite side, there is a collector region, of which the connection region, like the connection region of the base region, is situated at the surface of the semiconductor body. This is in contrast to a conventional bipolar transistor, wherein the collector region is generally situated below the base region. If, in the case of a conventional bipolar transistor, the emitter region and the collector region exchange places, the transistor is referred to as an inverted transistor. Also in the device in accordance with the invention, the emitter region may be situated, in a corresponding manner, below the base region. The collector region is situated in all cases next to, not below or above, the base region.

A drawback of the known device is that it is less suitable for certain applications. Particularly if it is used as a power transistor, it exhibits shortcomings. The size of the voltage range over which the transistor can be used and the robustness of said transistor with respect to short-lived, high voltage peaks are comparatively small. As a result, the use of said transistor is limited.

Therefore, it is an object of the present invention to provide a device which is suited for said applications, and which can be used over a large voltage range and exhibits a good resistance to short-lived, high voltage peaks.

To achieve this, a device of the type mentioned in the opening paragraph is characterized in accordance with the invention in that the base region contains a highly doped sub-region the doping concentration of which has a delta-shaped profile in the thickness direction, and said highly doped sub-region extends laterally as far as the collector region. The invention is based first of all on the recognition that said drawbacks are caused by excessively high currents and/or premature breakdown between the base and the collector. The invention is further based on the recognition that in the known transistor these phenomena are connected with the occurrence of avalanche multiplication of charge carriers, which in turn is caused by a high electric field strength at the location of the collector-base junction. Said high electrical field strength in turn is caused by a high doping concentration present in the base. However, said doping concentration must be high in order to counteract punch-through.

The invention is further based on the recognition that a highly doped, delta region does not have the above-mentioned drawbacks. On the one hand, the doping concentration in the base (sub-)region can be sufficiently high to preclude punch-through, on the other hand, the occurrence of a high field strength is precluded by the fact that such a delta-shaped profile has a small width. What also plays a part in this respect is that the avalanche multiplication of charge carriers depends not only on the height of the maximum field strength but also on the spatial distribution of the electric field. Both factors result in that the maximum electric field near the base-collector junction in a device in accordance with the invention is reduced with respect to a more conventional (lateral) bipolar transistor. In customary, non-lateral, bipolar transistors, the thickness of the base region is several tens of nanometers.

In a preferred embodiment of a device in accordance with the invention, the doping concentration of the sub-region ranges between $10^{19}$ and approximately $10^{20}$ at/cm$^3$, and the thickness of the sub-region ranges between 1 and 15 nm, preferably between 1 and 10 nm. Such a device has excellent high-frequency properties and a sufficiently high collector-base breakdown voltage.

In a favorable embodiment, the base region contains a mixed crystal of silicon and germanium. In such a device, there is a heterojunction between silicon and silicon-germanium, which heterojunction leads to a further improvement of the high-frequency behavior of the device in accordance with the invention.

In an attractive embodiment, the sub-region is provided with atoms which decelerate the diffusion of the doping atoms of the sub-region. By virtue thereof, a doping profile that is as narrow as possible can be maintained during and, particularly, after the formation of said sub-region. Preferably, the doping used comprises boron (atoms). In this case, the transistor is of the npn type, which is the fastest type. Atoms that proved suitable for decelerating the diffusion of boron atoms in the sub-region are carbon atoms. A concentration that proved to be suitable does not exceed the silicon or the silicon-germanium mixed crystal by more than one or a few atom percent.

In an important modification, wherein the base region contains a mixed crystal of silicon and germanium, a strain-relaxed buffer layer (SRB=Strain Relaxed Buffer layer) is situated in the semiconductor body below the base region. By virtue thereof, the development of defects, such as misfit dislocations, in the device is precluded or at least limited to parts thereof that are situated outside the transistor. Such a device may also advantageously comprise a strained silicon layer as the top layer. The mobility of the charge carriers in such a layer is higher than it would be in the absence of strain. This increased mobility has a favorable effect on the properties of a MOSFET (=Metal Oxide Semiconductor Field Effect Transistor) manufactured in and on said top layer. As a consequence of this and other factors, a device in accordance with the invention can particularly suitably be embodied so as to be a Bi(C)MOS (=Bipolar (Complementary) MOS) IC (=Integrated Circuit). Another factor that plays a role in this respect is that the masks necessary for the manufacture fit in well with the technology customarily used for said manufacture.

The fact that only a limited number of masks/masking steps are necessary is an important advantage in this connection.

For the latter applications, and in view of the high-frequency properties of the device, the semiconductor body is preferably separated from the semiconductor substrate by an electrically insulating layer. A lateral bipolar transistor, as described in the present invention, is particularly suitable for use in SOI (=Silicon-On-Insulator) CMOS (technology).

The collector region preferably is in an oblique position with respect to the surface of the semiconductor body, such that the distance from the collector region to the emitter region, viewed in projection, decreases in the thickness direction. In a lateral bipolar transistor in accordance with the invention, a large part of the injection current (of electrons) will flow from the emitter to the base in the thickness direction, while a small part will flow sideways to the collector. The lateral Gummel number will generally be (much) higher, however. Subsequently, the (electron) current diffuses across the base. This diffusion current may flow in the thickness direction as well as in the lateral direction. By said oblique position of the collector region, it can be achieved that this diffusion current flows preferentially in the lateral direction. Preferably, the collector region is formed by means of ion implantation. This technique is excellently suited for placing a formed semiconductor region in an oblique position, because the implantation can be carried out at an angle with respect to the surface. A further reason why ion implantation is a very suitable technique for forming the collector region resides in the fact that, in the device in accordance with the invention, the collector region borders on the surface.

A method of manufacturing a semiconductor device with a semiconductor body which is provided with a bipolar transistor with an emitter region, a base region and a collector region of, respectively, a first conductivity type, a second conductivity type opposite to the first conductivity type, and the first conductivity type, wherein, viewed in projection, the emitter region is formed above or below the base region, and the collector region is formed so as to border laterally on the base region, is characterized in accordance with the invention in that a highly doped sub-region is formed in the base region, the doping concentration of said highly doped sub-region being provided with a delta-shaped profile in the thickness direction, and said highly-doped sub-region being formed so as to extend laterally as far as the collector region. A device in accordance with the invention is thus obtained in a simple manner.

In a preferred embodiment of a method in accordance with the invention, the base region is formed by means of epitaxy. This technique can very suitably be used to form particularly narrow, delta-shaped doping profiles in a formed semiconductor region. Also the formation of a mixed crystal, for example of silicon and germanium, can be readily carried out in this way.

These and other aspects of the invention are apparent from and will be elucidated with reference to the embodiments described hereinafter.

Figure 2:
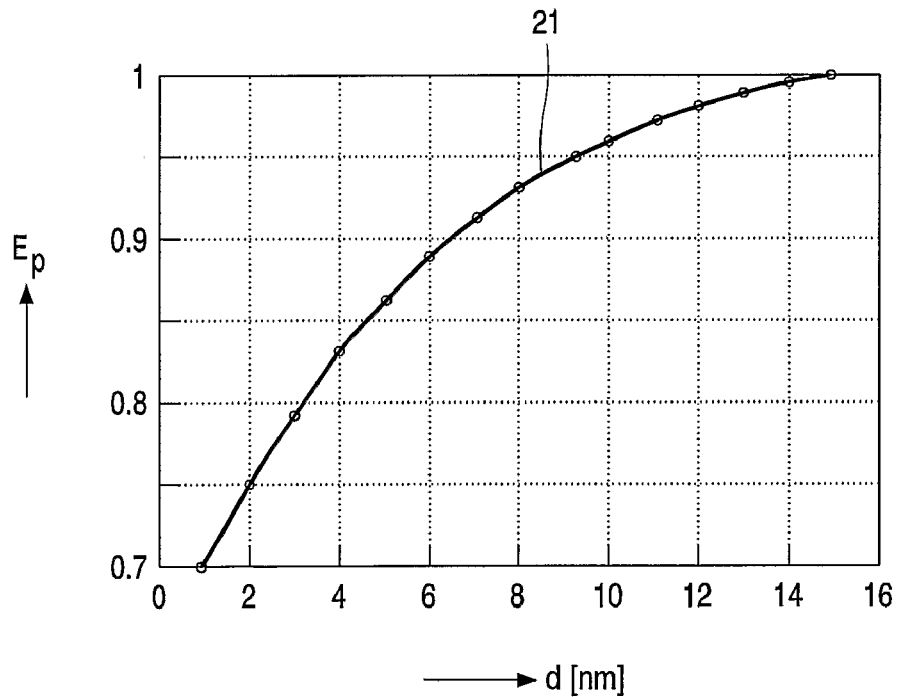
Figure 3:
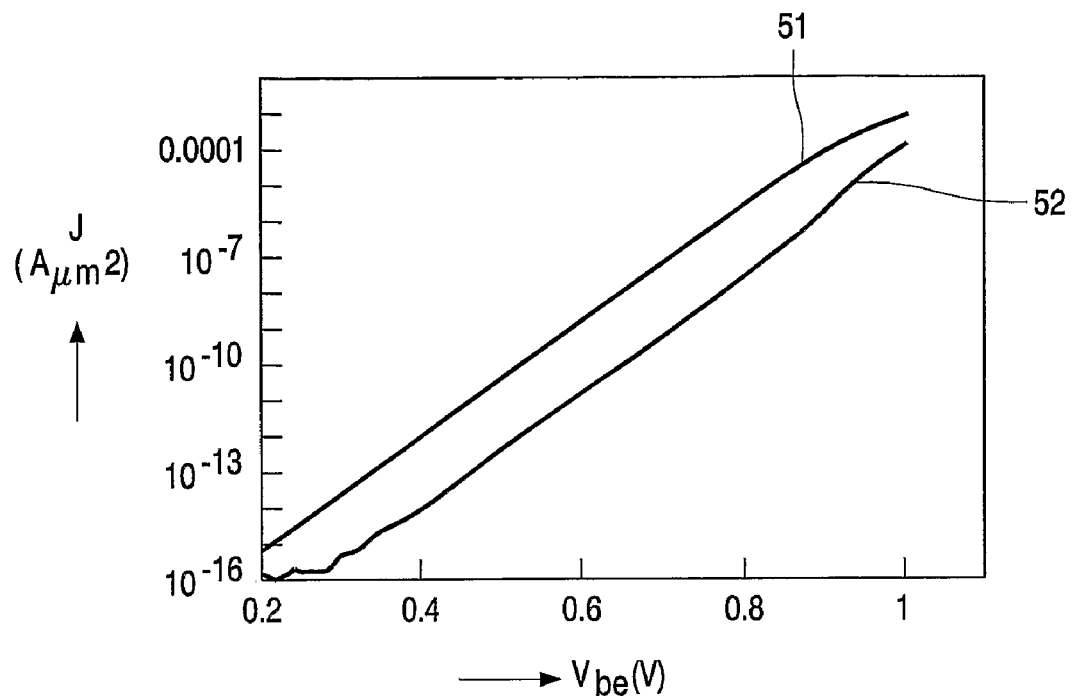
Figure 4:
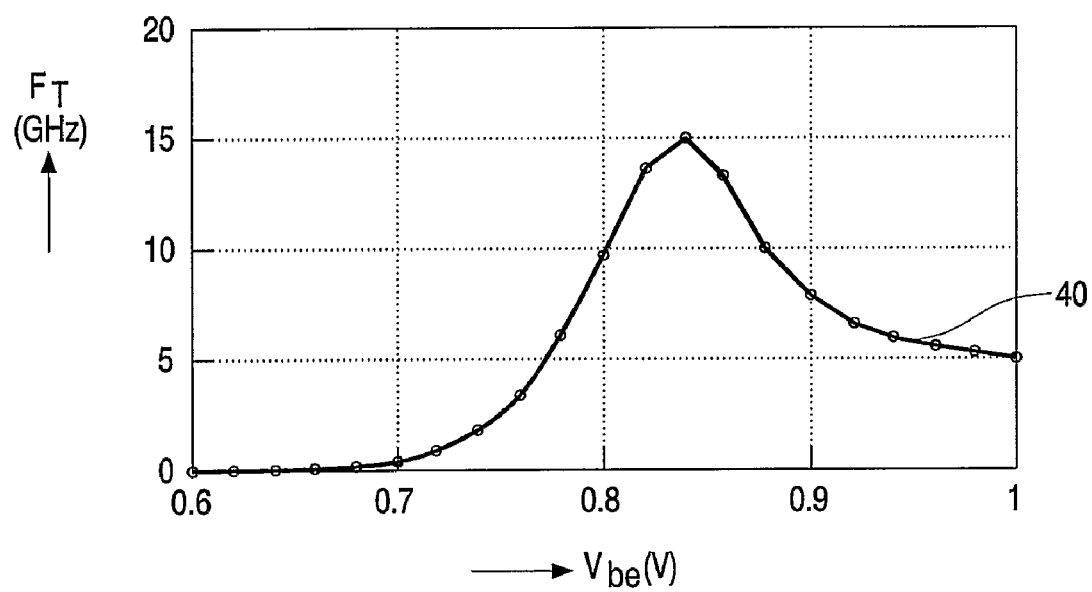
Figure 5:
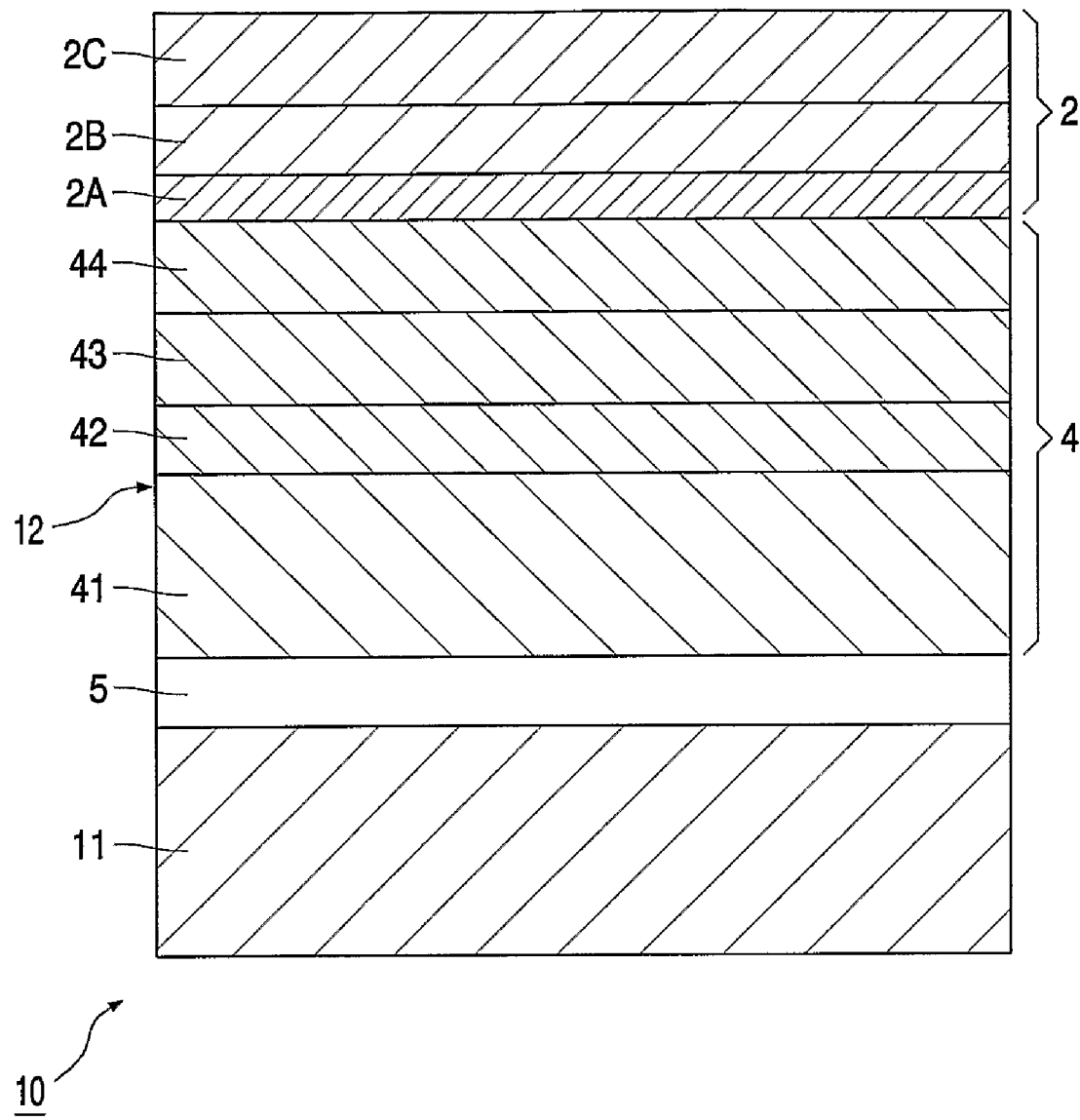

In the drawings:

FIG. 1 is a diagrammatic cross-sectional view, at right angles to the thickness direction, of an embodiment of a semiconductor device in accordance with the invention, FIG. 2 shows the normalized, maximum electric field strength ($E_p$) of the bipolar transistor of the device shown in FIG. 1, as a function of the thickness (d) of the sub-region of the base region, FIG. 3 shows the current density (J) of the bipolar transistor of the device of FIG. 1, as a function of the base-emitter voltage (Vbe), FIG. 4 shows the cut-off frequency (fT) of the bipolar transistor of the device of FIG. 1, as a function of the base-emitter voltage (Vbe), and FIG. 5 is a diagrammatic cross-sectional view, at right angles to the thickness direction, of the device of FIG. 1 in a stage of the manufacturing process by means of an embodiment of a method in accordance with the invention.

The Figures are not drawn to scale, and some dimensions are exaggerated for clarity. Corresponding regions or parts are indicated by means of the same hatching and the same reference numerals, whenever possible.

FIG. 1 is a diagrammatic cross-sectional view, at right angles to the thickness direction, of an embodiment of a semiconductor device in accordance with the invention. A device 10 shown in this example comprises (see FIG. 1) a substrate 11, in this case a p-type silicon substrate covered with an insulating layer 5, in this case of silicon dioxide. On this insulating layer there is provided, in this case, a semiconductor layer structure comprising a first semiconductor layer 4, here of SiGe, which is n-type doped and composed of various sub-layers which will be discussed hereinafter. On said semiconductor layer 4 there is provided a second semiconductor layer 2 which is lightly p-type doped and composed, in this case, of three sub-layers 2A, 2B, 2C. The first sub-layer 2A constitutes, in this case, a sub-region 2A of the base region 2 and is delta-shaped. This means that the doping concentration is very high, here approximately $10^{20}$ at/cm$^3$, and the thickness is very small, here approximately 2 nm. The first two sub-layers 2A, 2B contain an SiGe mixed crystal with a Ge content of approximately 20 at. %. In addition, approximately 1 at. % C is added to the first sub-layer 2A, causing the diffusion of the, in this case boron, atoms in the base sub-region 2A to be limited. The third sub-layer 2C contains silicon, and an emitter region 1 is locally formed therein. The silicon layer 2C is strained, which can be used to advantage during the formation, in said silicon layer, of the channel region of a MOS transistor, such as in the case of a Bi(C)MOS IC. Such a MOST is not shown in the drawing.

The base sub-region 2A is connected, on one side, to a highly doped, in this case p-type, base connection region 20 which is recessed in the surface of the semiconductor body 12. On the other side, the base sub-region 2A is connected to a collector region 3, in this case of the n-conductivity type, which is highly doped and recessed in the surface of the semiconductor body 12. The emitter region 3 of the (semi-)lateral transistor is, in this case, obliquely positioned with respect to the surface of the semiconductor body 12.

FIG. 2 shows the normalized, maximum electric field strength ($E_p$) of the bipolar transistor of the device of FIG. 1, as a function of the thickness (d) of the sub-region of the base region. Curve 21 illustrates the effect of a thin, delta-shaped, highly doped base sub-region 2A in a device 10 in accordance with the invention comprising a lateral bipolar transistor. At a thickness d below approximately 15 nm, the maximum field strength $E_p$ is substantially reduced. This maximum field strength $E_p$ is normalized to a field strength belonging to a thickness d of approximately 15. $E_p$ thus represents the reduction of the maximum field strength by a measure according to the invention. At a thickness of approximately 2 nm, the maximum field strength $E_p$ is approximately 30% lower, which is a substantial reduction. By virtue thereof, premature breakdown between the base region 2 and the collector region 3 is precluded to a substantial degree, resulting in a much higher usefulness of a device in accordance with the invention.

FIG. 3 shows the current density (J) of the bipolar transistor of the device shown in FIG. 1, as a function of the base-emitter voltage (Vbe), and FIG. 4 shows the cut-off frequency (fT) of the bipolar transistor of the device of FIG. 1, as a function of the base-emitter voltage (Vbe). Curve 51 of FIG. 3 corresponds to the collector current Ic, and curve 52 corresponds to the base current Ib, while the collector-base voltage is zero. This so-termed Gummel plot shows that the bipolar transistor has substantially ideal properties. Also curve 40 of FIG. 4 shows that, in principle, the device operates well. Further optimization to obtain the best parameters is possible, of course.

FIG. 5 is a diagrammatic cross-sectional view, at right angles to the thickness direction, of the device of FIG. 1 in a stage of the manufacturing process by means of an embodiment of a method in accordance with the invention. On the substrate 11 there is provided an insulating layer 5 on which a monocrystalline semiconductor layer structure 4, 2, as discussed in part hereinabove, is provided. The n-type semiconductor layer 4 here forms a so-termed SRB (=Strain Relaxed Buffer layer) and is composed, in this example, of a first sub-layer 41 containing 22 at. % SiGe, and having a thickness, in this case, of approximately 140 nm. A second sub-layer 42 contains the same mixed crystal but, in this case, approximately 1 at. % C has been added, and said second sub-layer has a thickness of approximately 5 nm. On said second sub-layer there is provided a third sub-layer 43 which also contains the same mixed crystal and which has a thickness of 70 nm. The fourth sub-layer 44 contains SiGe with a Ge content of approximately 20 at. %, and has a thickness, in this case, of approximately 30 nm.

The part 2 of the semiconductor layer structure, formed above said fourth sub-layer, has already been described hereinabove and is used for the formation of the heterojunction bipolar transistor of this example and for the formation of a MOS transistor, if necessary, as in the case of a Bi(C)MOS IC. The use of epitaxy when forming, in particular, the base sub-region 2A enables the latter to the readily provided with the desired delta-shaped doping profile. To this end, a doping gas, such as diborane, is added to the gas mixture used to epitaxially deposit the layers. This enables the desirable, very thin, highly doped layer 2A to be readily formed at a low growth rate, a low pressure and a high gas rate.

The starting structure described in FIG. 5 can be manufactured, for example, by epitaxially growing the monocrystalline layers 2, 4 on a so-termed BOX (=Buried Oxide) substrate 11 of a so-termed silicon-on-insulator (SOI) wafer. Alternatively, in a substrate 12, the buried insulating layer 5 can be formed by means of an ion implantation of oxygen ions. Above said layer there is a thin monocrystalline silicon layer, not shown in the Figure, which can be used as a nucleation layer for the growth process of the layers 2, 4. In an alternative method, the structure of FIG. 5 is obtained using a so-termed substrate-transfer technique. According to this technique, for example, the layers 2, 4 are grown on a silicon substrate, after which, subsequent to the provision of the layer structure onto an auxiliary plate, the substrate is removed by means of polishing and/or etch techniques. Instead of the removed substrate, a silicon substrate provided with a thermal oxide layer is then provided, after which the auxiliary plate is removed again.

The manufacture of the bipolar transistor and, if necessary, a MOST can be carried out using customary CMOS technology. This can be done, for example, as described in detail in the above-mentioned United States patent specification U.S. Pat. No. 6,384,469. In this connection it is noted once more that the device of this example is only diagrammatically shown in FIG. 1. For example, contrary to what is suggested in FIG. 1, the device 10 does not have to be a planar device. A connection region of the emitter region 3, whether or not provided with spacers, may project above the surface of the semiconductor body 12.

Before said transistor(s) is (are) formed, isolation regions, not shown in the drawing, are formed in the semiconductor body 12, which isolation regions are in the form of, for example, a so-termed STI (=Shallow Trench Isolation). This extends as far as the insulating layer 5, as a result of which the transistors formed are very well isolated with respect to each other and exhibit excellent high-frequency properties.

The invention is not limited to the examples given hereinabove, and, within the scope of the invention, many variations and modifications are possible to those skilled in the art. For example, besides in a BiMOS, the invention can also be applied in a BiCMOS (=Bipolar Complementary Metal Oxide Semiconductor) IC (=Integrated Circuit). The invention can also be applied to a pnp transistor.

Also with regard to a method in accordance with the invention, it applies that many variations and modifications are possible. For example, the highly doped part of the emitter region may also be formed by means of out-diffusion from in-situ doped polycrystalline silicon, or by means of gas-phase doping, or by means of a monocrystalline, local deposition of highly doped silicon.

The invention claimed is:

1. A semiconductor device with a semiconductor body comprising a bipolar transistor having an emitter region, a base region and a collector region of, respectively, a first conductivity type, a second conductivity type opposite to the first conductivity type, and the first conductivity type, wherein, viewed in projection, the emitter region is surrounded by the base region, and the collector region laterally borders the base region, wherein the base region contains a highly doped sub-region, wherein a doping concentration of the highly doped sub-region has a delta-shaped profile in a thickness direction, and said highly doped sub-region extends laterally to border the collector region, wherein the collector region is not located entirely below the base region, wherein the base region further comprises a first semiconductor layer attached on the highly doped sub-region and a second semiconductor layer attached on the first semiconductor layer, and wherein the first semiconductor layer contains an SiGe mixed crystal and the second semiconductor layer contains silicon.

2. The semiconductor device as claimed in claim 1, characterized in that the semiconductor body comprises silicon, and the doping concentration of the sub-region ranges between $10^{19}$ and approximately $10^{20}$ at/cm$^3$, and the thickness of the sub-region ranges between 1 and 15 nm.

3. The semiconductor device as claimed in claim 1, characterized in that the base region contains a mixed crystal of silicon and germanium.

4. The semiconductor device as claimed in claim 3, characterized in that the sub-region is provided with first atoms that decelerate a diffusion of second atoms of the sub-region.

5. The semiconductor device as claimed in claim 4, characterized in that the first atoms are carbon atoms.

6. The semiconductor device as claimed in claim 1, characterized in that the first conductivity type is an n-type, and boron atoms are used for doping the base region.

7. The semiconductor device as claimed in claim 1, characterized in that the semiconductor body comprises, below the base region, a strain-relaxed buffer (SRB) layer.

8. The semiconductor device as claimed in claim 1, characterized in that the semiconductor body is separated from a semiconductor substrate by an electrically insulating layer.

9. The semiconductor device as claimed in claim 1, characterized in that a first injection current of electrons flows from the emitter region to the base region, a second injection current of electrons flows from the emitter region to the collector region, the first injection current of electrons always being larger than the second injection current of electrons.

10. The semiconductor device as claimed in claim 1, characterized in that the device is suitable for high-power application.

11. The semiconductor device as claimed in claim 1, characterized in that the highly doped sub-region contains an SiGe mixed crystal.

* * * * *